(12) United States Patent
Lee et al.

(10) Patent No.: US 10,069,113 B2
(45) Date of Patent: Sep. 4, 2018

(54) ORGANIC LIGHT EMITTING DISPLAY DEVICE AND FABRICATING METHOD USING THE SAME

(71) Applicant: LG DISPLAY CO., LTD., Seoul (KR)

(72) Inventors: BuYeol Lee, Gyeonggi-do (KR); NamWook Cho, Gyeonggi-do (KR); HyoungSu Kim, Gyeonggi-do (KR); JaeMyon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/950,211

(22) Filed: Nov. 24, 2015

(65) Prior Publication Data

US 2016/0149164 A1    May 26, 2016

(30) Foreign Application Priority Data

Nov. 26, 2014   (KR) ........................ 10-2014-0166716

(51) Int. Cl.
*H01L 51/52*     (2006.01)
*H01L 27/32*     (2006.01)
*H01L 51/56*     (2006.01)

(52) U.S. Cl.
CPC ........ *H01L 51/5281* (2013.01); *H01L 27/322* (2013.01); *H01L 27/323* (2013.01); *H01L 51/5271* (2013.01); *H01L 51/56* (2013.01); *H01L 27/3279* (2013.01); *H01L 2227/323* (2013.01)

(58) Field of Classification Search
CPC ................. H01L 27/322; H01L 27/323; H01L 51/50–51/56; H01L 27/32–27/3297; G06F 3/041; G06F 3/0412; G06F 3/044
See application file for complete search history.

(56) References Cited

U.S. PATENT DOCUMENTS

| | | | |
|---|---|---|---|
| 2008/0211395 A1 | 9/2008 | Koshihara et al. | |
| 2009/0230853 A1* | 9/2009 | Kanai | H01L 51/0014 313/504 |
| 2009/0322702 A1* | 12/2009 | Chien | G06F 3/0412 345/174 |

(Continued)

FOREIGN PATENT DOCUMENTS

| | | |
|---|---|---|
| CN | 101257745 A | 9/2008 |
| CN | 101543133 A | 9/2009 |

(Continued)

OTHER PUBLICATIONS

Extended European Search Report dated Apr. 19, 2016, for corresponding European Patent Application No. 15196272.7.

(Continued)

*Primary Examiner* — Bryan Junge
(74) *Attorney, Agent, or Firm* — Morgan, Lewis & Bockius LLP

(57) ABSTRACT

An organic light emitting display device and a fabrication method comprising a touch electrode layer including touch electrodes and touch lines on an upper substrate which are directly formed on the upper substrate to secure a large distance between the touch electrodes and cathode as well as minimize a distance between the upper and lower substrates, thereby widening the viewing angle of an image while reducing a parasitic capacitance.

13 Claims, 5 Drawing Sheets

(56) References Cited

U.S. PATENT DOCUMENTS

| | | | |
|---|---|---|---|
| 2012/0105337 A1* | 5/2012 | Jun | G06F 3/0412 345/173 |
| 2013/0242211 A1 | 9/2013 | Lee | |
| 2014/0008668 A1* | 1/2014 | Hirakata | H01L 27/15 257/79 |
| 2014/0014960 A1 | 1/2014 | Yamazaki et al. | |
| 2014/0049503 A1* | 2/2014 | Cok | G06F 3/044 345/174 |
| 2014/0061597 A1 | 3/2014 | Choi et al. | |
| 2014/0070350 A1* | 3/2014 | Kim | G06F 3/044 257/432 |
| 2014/0117324 A1* | 5/2014 | Kim | H01L 27/323 257/40 |
| 2014/0139761 A1* | 5/2014 | Yanagawa | G06F 3/044 349/12 |
| 2014/0183478 A1 | 7/2014 | Lee et al. | |
| 2014/0327846 A1* | 11/2014 | Hata | G06F 3/041 349/12 |
| 2014/0346493 A1* | 11/2014 | Lee | G06F 3/0412 257/40 |
| 2015/0185904 A1* | 7/2015 | Kong | G06F 3/044 216/6 |
| 2015/0261370 A1* | 9/2015 | Yoo | G06F 3/0412 345/173 |

FOREIGN PATENT DOCUMENTS

| | | |
|---|---|---|
| CN | 203178627 U | 9/2013 |
| CN | 103681737 A | 3/2014 |
| EP | 2704196 A1 | 3/2014 |
| JP | 2010243930 A | 10/2010 |
| KR | 20140085306 A | 7/2014 |

OTHER PUBLICATIONS

The First Office Action dated Mar. 29, 2018, from The State Intellectual Property Office of the People's Republic of China in counterpart Chinese application No. 2015-10830450.8.

* cited by examiner

ORGANIC LIGHT EMITTING DISPLAY DEVICE AND FABRICATING METHOD USING THE SAME

CROSS-REFERENCE TO RELATED APPLICATION

Pursuant to 35 U.S.C. § 119(a), this application claims the benefit of earlier filing date and right of priority to Korean Application No. 10-2014-0166716, filed on Nov. 26, 2014, the contents of which is incorporated by reference herein in its entirety.

BACKGROUND

Field of Technology

The present disclosure relates to an organic light emitting display device, and more particularly, to an organic light emitting display device and a fabrication method thereof of an in-cell type touch integrated display device.

Description of the Related Art

A display device is used in electronic devices and the like. A touch screen has been implemented to allow a user to select a graphical object or region displayed on the screen.

The touch screen for a display device can be realized as an add-on type touch screen in which a touch panel is adhered on the display panel, or an in-cell type touch integrated display device in which touch electrodes and touch sensing lines are formed within the display panel. In particular, an in-cell type touch integrated display device is advantageous due to its improved touch sensitivity and thinness property.

A first substrate having a light emitting unit and a second substrate having a color filter, the in-cell type touch integrated display device includes touch electrodes configured with transmitting electrode (Tx) and receiving electrode (Rx) used in performing a touch operation on the second substrate, and to generate mutual capacitance within the touch electrodes, thereby measuring a change amount of the mutual capacitance generated at the time of touch to recognize whether or not there is a touch operation.

FIG. 1 is a view illustrating the cross-section of a display device having an in-cell structured touch panel in the related art.

Referring to FIG. 1, the display device 1 in the related art may include a lower substrate 10 formed to have a plurality of light emitting patterns for implementing an image and an upper substrate 30 bonded to the lower substrate 10 with a particular separation distance to implement protection from moisture permeation into the substrate, whereby the two substrates 10, 30 are bonded to each other using an adhesive 60.

The light emitting pattern layer 20 on the lower substrate 10 can include a light emitting unit for emitting light to an upper surface thereof and a driving unit for controlling the light emitting unit. Furthermore, the upper substrate 30 is formed to have a color filter layer 40 including a color filter for three primary colors (RGB: red, green, blue) to display color and a black matrix located at a side towards the lower substrate, and a touch electrode layer 50 including touch electrodes configured to recognize a user's touch contact operation and touch lines connected to the touch electrodes are formed on the color filter layer 40.

According to its structure, in the display device 1 of the related art, light corresponding to an image emitted from the light emitting pattern layer 20 is enters the color filter layer 40 provided on the upper substrate 30 to display a color image during a display operation, and also a touch operation is recognized according to a change of mutual capacitance on the touch electrode layer 50 when a touch sensing signal is generated by a user applying touch contact onto a surface of the upper substrate 30 during a touch operation.

Here, the viewing angle of light emitted to a front surface of the display device 1 through the upper substrate 30 during a display operation is determined by a distance between the upper substrate and the lower substrate.

FIGS. 2A and 2B are views illustrating a partial cross section of the display device in the related art, wherein the electrode 26 provided in a light emitting unit on the light pattern layer, and the color filter layer 40 and touch electrode layer 50 facing the electrode 26 are shown.

Here, the color filter layer 40 may include a color filter 41 for three primary colors and a black matrix 42 provided between portions of the color filters 41, and a planarization layer 44, and the touch electrode layer 50 may include a touch electrode 52 and a touch line 55.

Referring to FIGS. 2A and 2B, light (L1) passing through the electrode 26 of the lower substrate in a vertical direction can be viewed from the front surface of the display device, but light (L2) exiting at a particular angle ($\Theta$) inclined from the vertical direction is blocked by the black matrix 42 due to its structure and thus not viewable. In other words, the viewing angle decreases as the separation distance between the upper substrate and the lower substrate increases.

In order to improve the foregoing problem, when configured with a decreased separation distance between the lower substrate and the upper substrate, a distance between the electrode 26 and the black matrix 42 decreases, and thus light (L2) is viewed even at the same angle ($\Theta$). However, a distance between the electrode 26 and the touch electrode 52 also decreases (d1→d2) at the same time, and accordingly, a parasitic capacitance component formed between the electrode 26 and the touch electrode 52 increases (c1→c2). The parasitic capacitance component (c2) may have an effect on the touch electrode 52 to decrease the sensing characteristics, thereby reducing the overall sensitivity of the touch panel.

As a result, a distance (d1) above a predetermined level should be maintained between the electrode 26 and the touch electrode 52 on the lower substrate 10, resulting in a restriction in widening the viewing angle of the display device.

SUMMARY OF THE INVENTION

Accordingly, the present invention is directed to an organic light emitting display device and fabricating method using the same that substantially obviate one or more of the problems due to limitations and disadvantages of the related art.

An object of the present invention is to provide an organic light emitting display device capable of maintaining touch sensitivity while improving viewing angle characteristics in the organic light emitting display device in which a touch electrode is integrated within a touch panel, and a fabrication method thereof.

Another object of the present invention is to improve surface reflection due to a multi-buffer layer provided on an upper substrate in an organic light emitting display device using an organic light emitting diode as a light emitting unit.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings To achieve these and other advantages and in accordance with the purpose of the present invention, as embodied and broadly described, an organic light emitting display device may comprise a first substrate including a light emitting pattern layer having a plurality of thin film transistors and an organic light emitting diode, and a second substrate bonded to the first substrate and having a color filter layer. Here, the second substrate may include a color filter layer having a plurality of RGB color filters corresponding to the pixel, and a touch electrode layer including a plurality of touch lines between the second substrate and the color filter layer to correspond to boundaries between the plurality of pixels and a touch electrode electrically connected to the touch lines to correspond to the plurality of pixels. In addition, in order to accomplish the foregoing technical aspects, as an embodiment according to another aspect, there is provided a fabrication method of an organic light emitting display device, and the method may include preparing an upper substrate, forming a touch electrode layer comprising a plurality of touch lines corresponding to boundaries between the plurality of pixels and a touch electrode electrically connected to the touch lines to correspond to the plurality of pixels, forming a color filter layer comprising a plurality of RGB color filters on the touch electrode layer, and bonding the upper substrate to a lower substrate comprising a light emitting pattern layer.

In an organic light emitting display device according to another embodiment of the present disclosure, a touch electrode layer including touch electrodes and touch lines formed on an upper substrate may be directly formed on the upper substrate to secure a large distance between the touch electrodes and cathode as well as reduce a distance between the upper and lower substrates, thereby obtaining an effect of widening the viewing angle of an image while reducing a parasitic capacitance between the touch electrode layer and the cathode electrode.

Furthermore, in an organic light emitting display device according to another embodiment of the present disclosure, a multi-buffer layer may be formed on the touch electrode other than the substrate, thereby obtaining another effect of reducing a surface reflectance on the upper substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
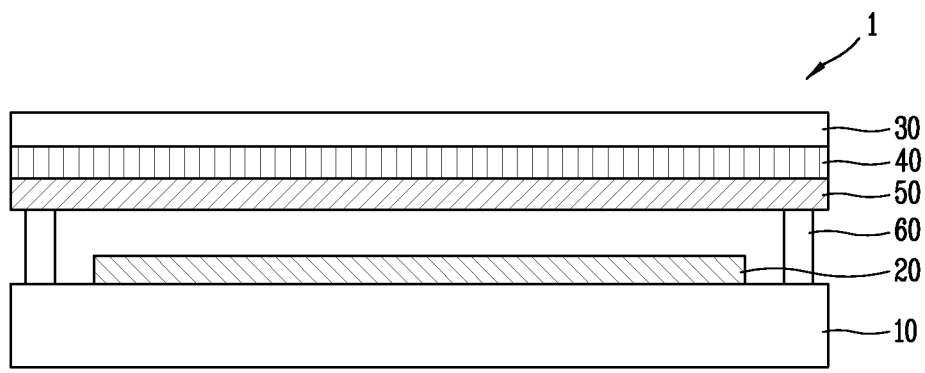
FIG. 1 is a view illustrating the cross-section of a display device having an in-cell structured touch panel in the related art.

Advantages and features of the present disclosure, and methods of accomplishing the same will be clearly understood with reference to the following embodiments described in detail in conjunction with the accompanying drawings. However, the present disclosure is not limited to those embodiments disclosed below but may be implemented in various different forms. It should be noted that the present embodiments are merely provided to make a full disclosure of the invention and also to allow those skilled in the art to know the full range of the invention, and therefore.

A shape, a size, a ratio, an angle, a number or the like disclosed in the drawings for describing an embodiment of the present disclosure may be illustrative, and thus may not be necessarily limited to the details illustrated in the present disclosure. Furthermore, like reference numerals refer to like or similar elements throughout the specification. In describing the embodiments of the present disclosure, the detailed description will be omitted when a specific description of known technologies to which the invention pertains is judged to obscure the gist of the present invention.

When the term "comprising," "having", "consisting of," or the like is used in the present disclosure, another portion or additional elements may be added unless the term "only" is used. Unless clearly indicated otherwise, expressions in the singular number include a plural meaning.

In analyzing the constituent elements, they shall be construed to include a margin of error unless clearly indicated otherwise.

In case of the description of a positional relationship, for example, when the term "on", "over", "below", "beside" or the like is used to explain a positional relationship of two portions, one or more other portions may be located between the two portions unless the term "immediately" or "directly" is used.

In case of the description of a temporal relationship, for example, when the term "after", "subsequent to", "then", "before" or the like is used to explain a temporal preceding and subsequent relationship, it may include a case of non-continuity unless the term "immediately" or "directly" is used.

The terms including an ordinal number such as first, second, etc. can be used to describe various elements, but the elements should not be limited by those terms. The terms are used merely for the purpose to distinguish one element from another. Accordingly, a first element mentioned below may be a second element without departing from the technical aspects of the invention.

The features of various embodiments of the present disclosure, respectively, may be combined or mixed in part or entirely, and various technical interactions and operations may be available. As such, the embodiments, respectively, may be carried out in an independent or interactive manner to one another.

Hereinafter, an organic light emitting display device and a fabrication method thereof according to certain embodiments of the present disclosure will be described with reference to the accompanying drawings.

Figure 3:
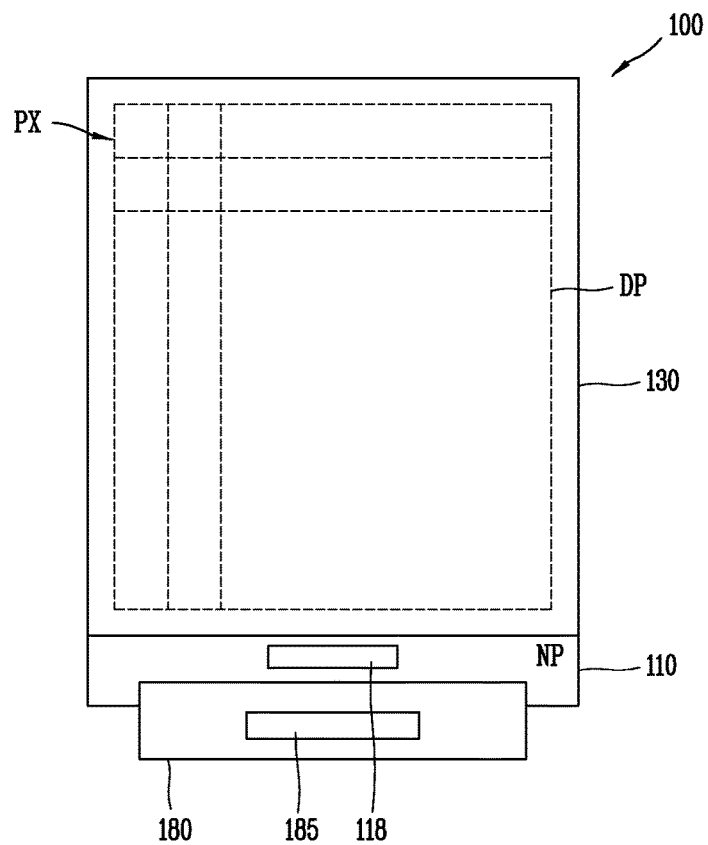
FIG. 3 is a plan view illustrating the structure of an organic light emitting display device according to an example embodiment of the present disclosure.
Figure 4:
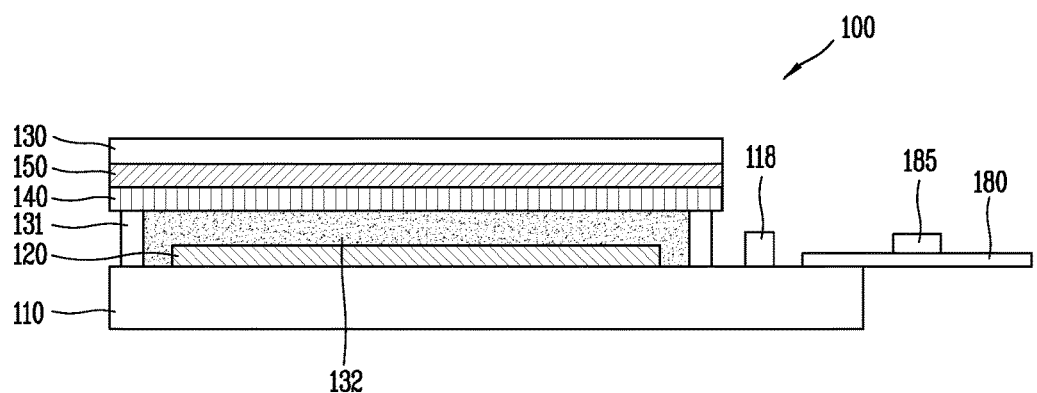
FIG. 4 is a cross-sectional view illustrating the structure of an organic light emitting display device according to an example embodiment of the present disclosure.

FIG. 3 is a plan view illustrating the structure of an organic light emitting display device according to an example embodiment of the present disclosure, and FIG. 4 is a cross-sectional view illustrating the structure of an organic light emitting display device according to an example embodiment of the present disclosure.

Referring to FIGS. 3 and 4, an organic light emitting display device 100 according to an example embodiment of the present disclosure is a top-emission type organic light emitting display device 100. The type-emission type may denote an organic light emitting display device 100 in which light for an image is emitted in the direction of the upper substrate 130. The organic light emitting display device 100 according to an example embodiment of the present disclosure may include a lower substrate 110 defined with a plurality of pixels (PXs), and a circuit substrate 180 in which an upper substrate 130 formed with a color filter is bonded thereto to form one touch panel, and attached to one side of the touch panel.

Various elements and conductive lines used for displaying an image are formed on the lower substrate 110. In particular, an organic light-emitting diode (OLED), a plurality of thin film transistors and capacitors for controlling the organic light-emitting diode, a plurality of signal lines, and a planarization layer, and the like are formed on the display area (DP) of the lower substrate 110 in the unit of pixels (PXs). The thin film transistors and planarization layer form a light emitting pattern layer 120 on the lower substrate 110. The signal line is extended to the non-display region (NP) of the lower substrate 110 and electrically connected to a drive integrated circuit (IC) 118.

The upper substrate 130 is disposed to face the lower substrate 110 with a predetermined separation distance, and bonded to the lower substrate 110 by a seal member 131 to seal an inside thereof. The seal member may be a resin type adhesive. However, the present disclosure may not be necessarily limited to this, and the upper substrate 130 may be bonded to the lower substrate 110 by a face-seal which is film type adhesive layer 132 formed on a front surface of one substrate. The upper substrate 130 may include a touch electrode layer 150 including touch electrodes and touch lines used for sensing a touch operation on the screen and a color filter layer 140 including color filters for implementing three primary colors. As a result, the upper substrate 130 may perform a function of implementing colors, as well as a touch recognition function and a function of suppressing external moisture from being infiltrated into the inside thereof.

Furthermore, a polarizer may be bonded to the upper substrate 130. The polarizer may absorb the reflected light incident to the organic light emitting display device from the ambient environment.

The upper and the lower substrate 110, 130 may be formed of a plastic material having flexible characteristics to maintain display performance when the organic light emitting display device is bent or flexed in any way.

On the other hand, the drive IC 118 electrically connected to the pixels (PXs) to provide signals for driving the pixels (PXs) can be mounted in an outer region of the display area (DP) at one side end of the lower substrate 110.

The drive IC 118 performs a function of supplying an image signal, a control signal and the like for driving pixels (PXs) and receiving the sensed touch signal to determine the touched position. The drive IC 118 may include a scan driving unit configured to control pixels in a scan direction, a data driving unit configured to supply an image signal to each pixel, and a touch driving unit configured to receive a touch signal. The configuration of the scan driving unit may be implemented in a thin film transistor formed on the non-display area (NP) of the lower substrate 110 and thus removed from the drive IC 118.

Furthermore, a main substrate 180 electrically connected to the drive IC 118 and a timing IC 185 mounted on the main substrate 180 can be provided at one side of the non-display area (NP) of the lower substrate 110.

The main substrate 180 is configured to electrically connect the lower substrate 110 to the timing IC 185, and a substrate with a flexible material may be used therefor. Furthermore, the timing IC 185 may be connected to an external system to perform a function of receiving timing signals and image-related signals such as a synchronization signal to convert them into a format that can be processed by the organic light emitting display device, and generating a control signal of the drive IC 118 to provide such to the drive IC 118.

According to such configuration, the organic light emitting display device 100 according to an example embodiment of the present disclosure has an in-cell structure in which a display panel and a touch panel are implemented with one panel. In particular, according to an example embodiment of the present disclosure, a touch electrode layer 150 may be directly formed on the upper substrate 130 and a color filter layer 140 may be formed in the direction of the lower substrate 110, thereby maximizing a separation distance between the touch electrode layer 150 and the light emitting pattern layer 120 on the lower substrate 110 to minimize a parasitic capacitance as well as minimizing a separation distance between the color filter layer 140 and the light emitting pattern layer 120 to increase the viewing angle.

Hereinafter, the structure of an organic light emitting display device according to an example embodiment of the present disclosure will be described in more detail with reference to an enlarged cross-sectional view for the organic light emitting display device of the present disclosure.

Figure 5:
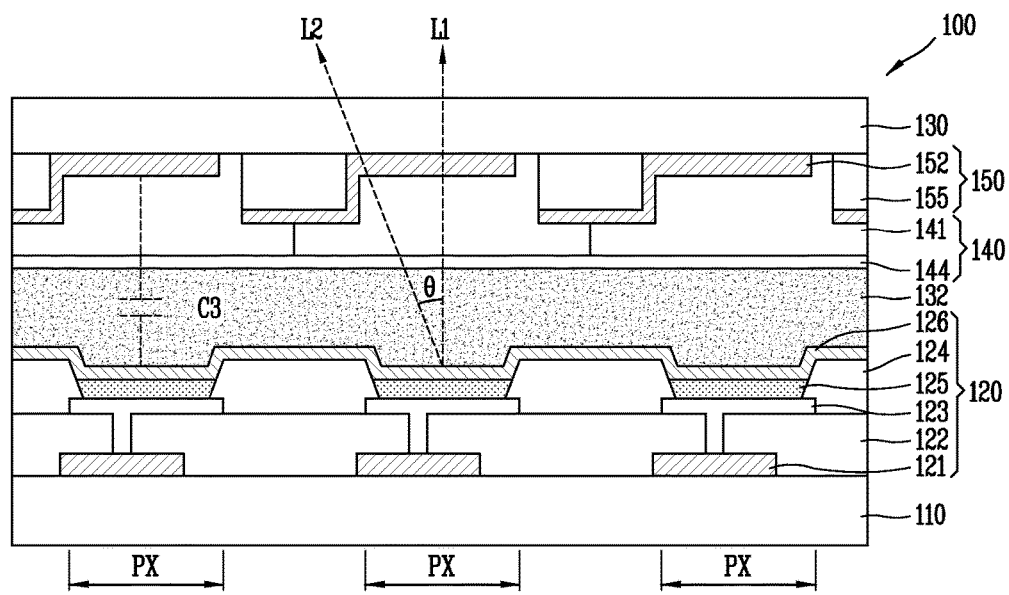
FIG. 5 is an enlarged cross-sectional view illustrating part of an organic light emitting display device according to an example embodiment of the present disclosure.

FIG. 5 is an enlarged cross-sectional view illustrating part of an organic light emitting display device according to an example embodiment of the present disclosure.

Referring to FIG. 5, the organic light emitting display device 100 according to an example embodiment of the present disclosure may include a first substrate 110 defined with a plurality of pixels (PXs), and provided with a light emitting pattern layer 120 including a plurality of thin film transistors and an organic light emitting diode on the pixel (PX), and a second substrate 130 bonded to the first substrate 110 in a facing manner, and the second substrate 130 may include a color filter layer 141 including a plurality of RGB color filters corresponding to the pixel (PX), and a touch electrode layer 150 including a plurality of touch lines 155 disposed between the second substrate 130 and the color filter layer 141 to correspond to boundaries between the plurality of pixels (PXs) and a touch electrode 152 electrically connected to the touch lines 155 to correspond to the plurality of pixels (PXs).

Specifically, the first substrate 110 as a substrate made of a glass or plastic material, is defined with a display area (DP)

and a non-display area (NP), and the light emitting pattern layer 120 is formed within the display area (DP).

The light emitting pattern layer 120 includes a thin film transistor array 121, a planarization layer 122, a first electrode 123, a bank layer 124, an organic light emitting layer 125 and a second electrode 126.

Here, the thin film transistor array 121 may include a scan line and a data line, and a capacitor and a thin film transistor at the cross section between the two lines. The thin film transistor array 121 is electrically connected to the first electrode 123 configured to control an organic light-emitting diode to be driven.

The planarization layer 122 is formed over the upper surface of the lower substrate 110 on the thin film transistor array 121. The planarization layer 122 may have a function of reducing a step or uneven surface created by the thin film transistor array 121 to form elements at an upper portion thereof and a function of insulating the thin film transistor array 121.

The first electrode 123 in contact with thin film transistor array 121 is formed on the planarization layer 122. The first electrode 123 corresponds to each pixel (PX), and the upper surface is exposed by an opening portion formed on the bank layer 124, and connected to the thin film transistor array 121 therebelow. The first electrode 123 may be an anode electrode of the organic light-emitting diode, and further include a reflective layer for reflecting light in the direction of the second substrate 130. The bank layer 124 is formed on the planarization layer 122 and first electrode 123.

The bank layer 124 is formed over the upper surface of the first substrate 110, and an opening portion is formed in a lattice shape to expose the first electrode 123 so as to correspond to each pixel. However, the present disclosure may not be necessarily limited to this, and the opening portion may be modified in various ways according to the shape of each pixel. For example, the opening portion may be formed in a diamond shape in order to correspond to diamond shaped pixels. The organic light emitting layer 125 is formed within an opening portion of the bank layer 124.

As a layer formed within an opening portion of the bank layer 124, the organic light emitting layer 125 may be formed through a printing technique that employs certain equipment such as inkjet, aerosol, pen and the like, or through a deposition technique. The organic light emitting layer 125 may be a structure interposed with a hole injection layer (HIL), a hole transport layer (HTL), an electron transport layer (ETL), an electron injection layer (EIL) and an emission layer (EML). All of such layers may be discrete or may be implemented such that certain functions are combined into one or more layers. Furthermore, such layers cooperate to emit light with a specific wavelength band such as red, green, blue or white by a voltage applied to the first and the second electrode 122, 126.

The second electrode 126 is formed on the organic light emitting layer 125 and on the upper surface of the bank layer 124. The second electrode 126 may be formed of magnesium-silver (MgAg), which is a translucent metal, and configured as a cathode electrode of the organic light-emitting diode to face the first electrode 123.

The second substrate 130 is disposed to face the first substrate 110 and bonded to the first substrate 110 by the seal member 131 and adhesive layer 132 to seal an inside thereof. The second substrate 130 is a substrate made of a glass or plastic material, and the touch electrode layer 150 is formed on one surface in the direction of the first substrate 110.

The touch electrode layer 150 may include a touch electrode 152 formed of a first and a second electrode crossed with each other at a position corresponding to each pixel and a touch line 155 electrically connected to the touch electrode 152. The touch electrode 152 is electrically connected to the touch line 155 by covering the touch line 155. Furthermore, the touch electrode 152 may be formed of a transparent metal, and the touch line 155 may be formed of a non-transparent metal. In particular, as a metal having a low reflection characteristic, the touch line 155 according to an example embodiment of the present disclosure may be disposed to correspond to a boundary of each pixel to further have a black matrix function, thereby having an advantage of omitting the need for a separate black matrix structure. According to the foregoing configuration, the touch line 155 may absorb ambient reflection, thereby having an advantage of widening the ambient contrast ratio as well as removing the need for a circular polarizer that absorbs ambient reflection.

A color filter layer 140 including a color filter 141 corresponding to RGB primary colors and a multi-buffer layer 144 is formed on the touch electrode layer 150, namely, on a surface in the direction of the first substrate 110.

The color filter layer 140 performs a function of converting white light (L1, L2) incident from the organic light-emitting diode into RGB primary colors to emit it onto the upper surface of the second substrate 130. Here, when the pixels of the organic light emitting display device are configured to emit R, G, B and W colors, the color filter 141 may be omitted on a pixel corresponding to the white (W). However, the present disclosure may not be necessarily limited to this, and even when the pixels of the organic light emitting display device are configured to emit R, G, B and W colors, the color filter 141 may be added to enhance the ambient contrast ratio. In other words, when an R color filter is disposed on an R pixel, such does not have an effect on the emitted light, but the ambient contrast ratio can be enhanced since ambient light is partially absorbed on the R color filter. The ambient contrast ratio can be also enhanced on the G and B pixels due to the same principle, and thus the redundant description thereof will be omitted.

The multi-buffer layer 144 is formed on the color filter layer 140. The multi-buffer layer 144 may be formed of one or more inorganic layers, and configured with continuous or alternate layers of $SiN_x$ or $SiO_2$. The multi-buffer layer 144 is thus configured to suppress external moisture from being infiltrated into the organic light emitting layer 125 of the first substrate 110.

Figure 2A:
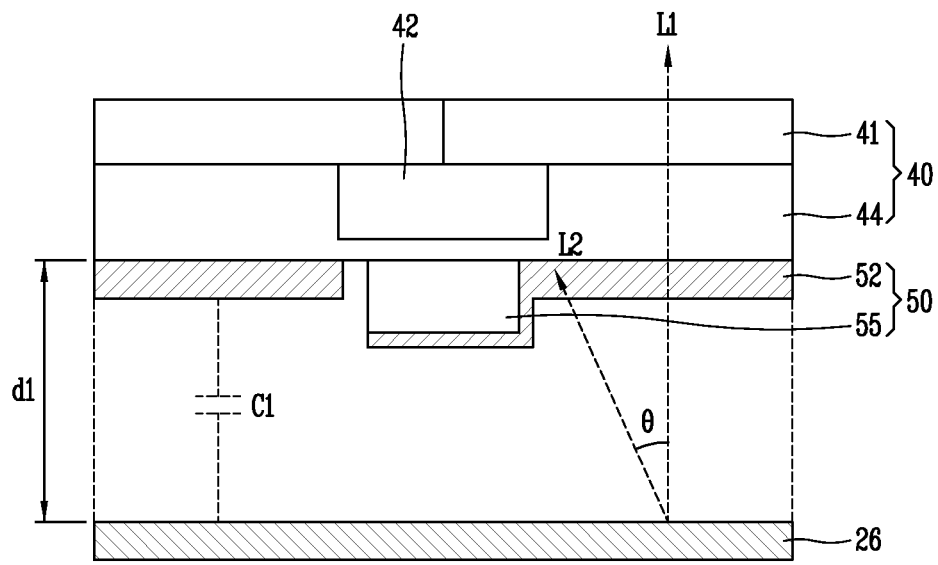
FIGS. 2A and 2B are view illustrating a partial cross section of the display device in the related art.
Figure 2B:
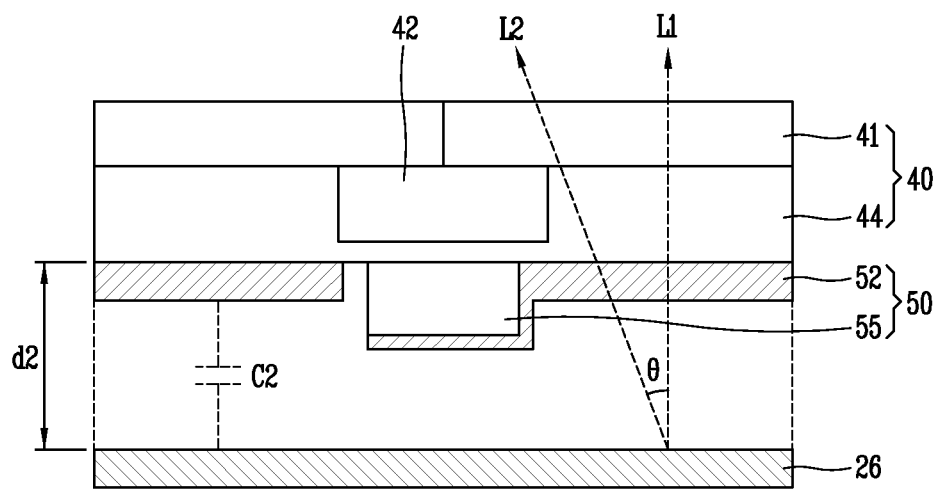

According to the structure, a distance between the touch electrode 152 of the second substrate 130 and the second electrode 126 of the first substrate 110 becomes the maximum, and a parasitic capacitance (C3) between the two electrodes is the same or smaller compared to the related art {C3=C1 (FIG. 2A), C3<C2 (FIG. 2B)}, and light (L2) emitted at an predetermined angle (Θ) inclined with respect to light (L1) emitted to the front surface is also emitted to the outside without being blocked by the touch line 155 configured as a black matrix, thereby having an effect of increasing viewing angle.

On the other hand, the color filter 141 is typically formed of a resin material, and it is fabricated with a spin coating method or the like, thereby resulting in an uneven surface as well as a non-uniform height. Such may be a cause of creating a gap on the multi-buffer layer 144 formed at an upper portion thereof, thereby causing a problem of introducing moisture.

Hereinafter, the structure of an organic light emitting display device according to another example embodiment of the present disclosure for further suppressing moisture infiltration will be described.

Figure 6:
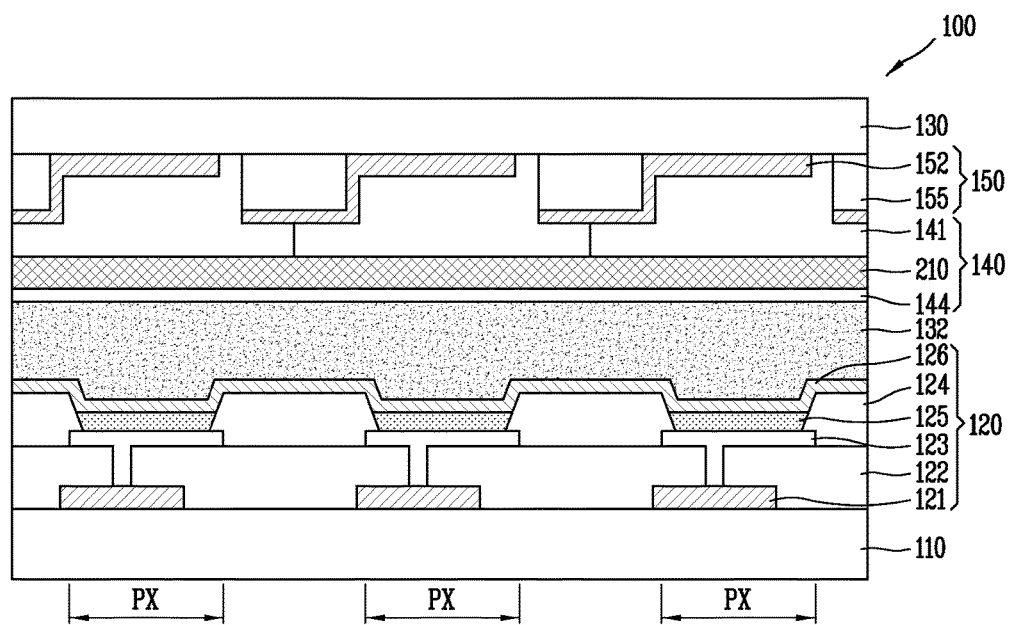
FIG. 6 is an enlarged cross-sectional view illustrating part of an organic light emitting display device according to another example embodiment of the present disclosure.

FIG. 6 is an enlarged cross-sectional view illustrating part of an organic light emitting display device according to another example embodiment of the present disclosure.

Referring to FIG. 6, an organic light emitting display device 100 according to another example embodiment of the present disclosure may include a first substrate 110 provided with a light emitting pattern layer 120 including a plurality of thin film transistors and an organic light emitting diode, and a second substrate 130 bonded to the first substrate 110 in a facing manner, and provided with a color filter layer 140. In particular, the second substrate 130 may include a touch electrode layer 150 including a plurality of touch lines 155 corresponding to boundaries between the plurality of pixels (PXs) and a touch electrode 152 electrically connected to the touch lines 155 to correspond to the plurality of pixels (PXs), and a color filter layer 130 configured with a plurality of RGB color filters 141 and a multi-buffer layer 144 disposed for each pixel region, respectively, on the touch electrode layer 150, and a planarization layer 210 may be further provided between the color filter 141 and the multi-buffer layer 144.

In other words, according to the present example embodiment, the structure and function of the first substrate 110 are the same as those of the foregoing embodiment, but there is a difference in that the planarization layer 210 for compensating the surface roughness of the color filter 141 is provided on the second substrate 130 disposed to face the first substrate 110.

Here, the planarization layer 210 does not have an effect on a parasitic capacitance, and also does not have an effect on an angle of light emitted from the organic light emitting layer 125 since a distance between the touch electrode 152 and the second electrode 126 of the first substrate 110 is the same as that of the foregoing embodiment as the planarization layer 210 is added into an upper color filter layer 140 of the touch electrode layer 150.

Furthermore, the planarization layer 210 is provided on the color filter 141 with an uneven surface configured to fill a gap created between the multi-buffer layers 144 formed on the surface thereof, thereby effectively suppressing moisture infiltration.

Hereinafter, a fabrication method of an organic light emitting display device according to an example embodiment of the present disclosure will be described with reference to the accompanying drawings. The following description will be described with reference to FIG. 5 for the cross-section of an organic light emitting display device according to the present disclosure.

Figure 7:
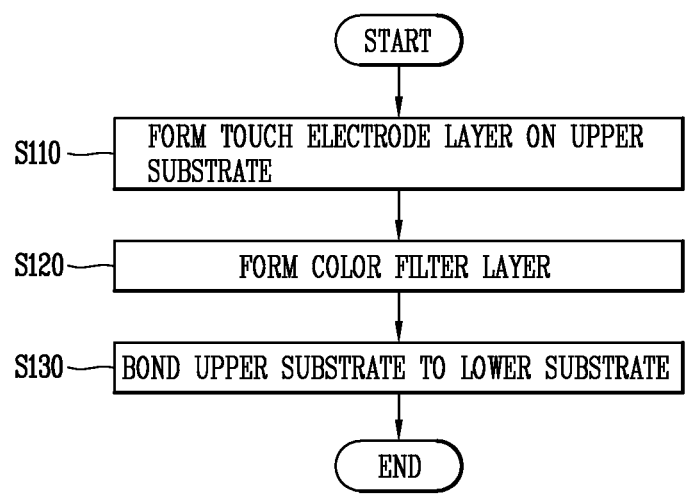
FIG. 7 is a flow chart illustrating a fabrication method of an organic light emitting display device according to an example embodiment of the present disclosure.

FIG. 7 is a flow chart illustrating a manufacturing method of an organic light emitting display device according to an example embodiment of the present disclosure.

Referring to FIGS. 5 and 7, a manufacturing method of an organic light emitting display device according to an example embodiment of the present disclosure may include forming a touch electrode layer 150 including a plurality of touch lines 155 corresponding to boundaries between the plurality of pixels (PXs) and a touch electrode 152 electrically connected to the touch lines 155 to correspond to the plurality of pixels (Pxs) (S110), forming a color filter layer 140 including a plurality of RGB color filters 141 on the touch electrode layer 150 (S120), and bonding the upper substrate 130 to a lower substrate including a light emitting pattern layer 120 (S130).

First, the step (S110) of forming the touch electrode layer 150 is a process of forming the touch electrode 152 on the second substrate 130 to correspond to the pixel region using a transparent metal material, and the touch line 155 between the pixels using a non-transparent metal material. Here, the first and the second electrode facing to each other and an insulating material therebetween may be deposited to form the touch electrode 152.

Subsequently, the step (S120) of forming the color filter layer 140 forms the color filter 141 to correspond to each pixel region using a color resin corresponding to RGB primary colors, respectively, on the touch electrode layer 150, and SiNx or $SiO_2$ may be deposited thereon to form the multi-buffer layer 144. Furthermore, as an example embodiment for suppressing moisture infiltration, the step of forming a planarization layer (reference numeral 210 in FIG. 6) subsequent to the formation of the color filter 141 may be added thereto. When the color filter layer 140 is formed through this step, the process for an upper substrate will be completed.

Meanwhile, an additional step of preparing a lower substrate prior to or subsequent to step S110 or S120 could be performed. The step of preparing a lower substrate refers to preparing the first substrate 110 made of a glass or plastic material, and forms the thin film transistor array 121 including thin film transistors and capacitors, and signal lines connected thereto is formed on a plurality of pixel regions defined on the first substrate 110. Subsequently, the planarization layer 122 of the substrate is formed on the thin film transistor array 121 and the first electrode 123 is formed on thereon. Here, the first electrode 123 may be formed using a non-transparent material such as aluminum (Al), or silver alloy.

Next, the bank layer 124 having an opening portion is formed on the upper surface of the first substrate 110 formed with the planarization layer 122 and first electrode 123. The bank layer 124 may be formed using a resist material. The organic light emitting layer 125 is formed within the opening portion, and the second electrode 126 is formed using a transparent metal on the upper surface of the first substrate 110 including the bank layer 124 and organic light emitting layer 125, thereby completing the preparation process for a lower substrate.

Next, the fabrication process of an organic light emitting display device is completed through the step (S130) of bonding the process-completed upper substrate and lower substrate to each other. The bonding process is carried out to seal the inner portions of two substrates using a sealing material, and a distance between the upper substrate and the lower substrate is determined within a range not to reduce viewing angle as well as to maximize a distance between the touch electrode 152 and the second electrode 126.

Although many subject matters have been specifically disclosed in the foregoing description, they should be construed as an illustration of preferred embodiments rather than a limitation to the scope of invention. Consequently, the invention should not be determined by the embodiments disclosed herein but should be determined by the claims and the equivalents thereof.

What is claimed is:

1. An organic light emitting display device, comprising:
 a first substrate including a plurality of pixels, each pixel including a thin film transistor and a light emitting pattern layer having an organic light emitting diode; and
 a second substrate facing toward the first substrate,
 wherein the organic light emitting diode comprises:

a first electrode;
a bank layer on the first electrode, the bank layer having an opening portion exposing the first electrode;
an organic light emitting layer on the first electrode within the opening portion of the bank layer; and
a second electrode on the organic light emitting layer, and
wherein the second substrate comprises:
a second substrate base;
a color filter layer comprising a plurality of RGB color filters each corresponding to respective ones of the plurality of pixels; and
a touch electrode layer between the second substrate base and the color filter layer, the touch electrode layer comprising a plurality of touch lines, of a non-transparent low-reflection metal, disposed corresponding to boundaries between the plurality of pixels to block a light through the boundaries between the plurality of pixels and to absorb ambient reflection, and a touch electrode electrically connected to the touch lines and corresponding to the plurality of pixels,
wherein the touch electrode directly covers and directly contacts surfaces of the touch lines that face the first substrate and a surface of the second substrate base that faces the first substrate, and
wherein the touch lines overlap the bank layer.

2. The organic light emitting display device of claim 1, further comprising a multi-buffer layer on the color filter layer over the upper surface of the first substrate.

3. The organic light emitting display device of claim 2, further comprising a planarization layer between the color filter layer and the multi-buffer layer.

4. The organic light emitting display device of claim 1, wherein the touch electrode covers the touch lines and the color filters completely cover the touch electrode.

5. The organic light emitting display device of claim 4, wherein adjacent ones of the RGB color filters directly abut, and boundaries between adjacent ones of the RGB color filters are disposed corresponding to the touch lines.

6. The organic light emitting display device of claim 1, wherein the touch electrode includes a transparent conductive metal.

7. A method of fabricating an organic light emitting display device, the method comprising:
preparing an upper substrate;
forming a plurality of touch lines of a non-transparent low-reflection metal disposed corresponding to boundaries between a plurality of pixels to block a light through the boundaries between the plurality of pixels and to absorb ambient reflection;
forming a touch electrode electrically connected to the touch lines to correspond to the plurality of pixels, the touch lines and the touch electrode configured to form a touch electrode layer on the upper substrate;
forming a color filter layer comprising a plurality of RGB color filters on the touch electrode layer;
forming a light emitting pattern layer having a first electrode, a bank layer having an opening portion exposing the first electrode on the first electrode, an organic light emitting layer on the first electrode within the opening portion of the bank layer, and a second electrode on the organic light emitting layer on a lower substrate; and
bonding the upper substrate to a lower substrate having a light emitting pattern layer,
wherein the touch electrode directly covers and directly contacts surfaces of the touch lines that face the lower substrate and a surface of the upper substrate that faces the lower substrate, and
wherein the touch lines overlap the bank layer.

8. The method of claim 7, further comprising:
forming a planarization layer on the color filter layer subsequent to forming the color filter layer.

9. The method of claim 8, further comprising:
forming a multi-buffer layer over the upper surface of the upper substrate subsequent to forming the color filter layer.

10. The method of claim 7, further comprising:
forming a multi-buffer layer over the upper surface of the upper substrate subsequent to forming the color filter layer.

11. The method of claim 7, wherein the touch electrode covers the touch lines and the color filters completely cover the touch electrode.

12. The method of claim 11, wherein adjacent ones of the RGB color filters directly abut, and boundaries between adjacent ones of the RGB color filters are disposed corresponding to the touch lines.

13. The method of claim 7, wherein the color filters completely cover surfaces of the touch electrode that face the lower substrate.

* * * * *